United States Patent [19]
Noelscher et al.

[11] Patent Number: 5,284,724
[45] Date of Patent: Feb. 8, 1994

[54] PHASE MASK FOR PROJECTION LITHOGRAPHY AND METHOD FOR THE MANUFACTURE THEREOF COMPRISING A SELECTIVELY ETCHABLE PHASE SHIFT LAYER DIRECTLY ON SUBSTRATE

[75] Inventors: Christoph Noelscher, Munich; Leonhard Mader, Ottobrunn, both of Fed. Rep. of Germany

[73] Assignee: Siemens Aktiengesellschaft, Munich, Fed. Rep. of Germany

[21] Appl. No.: 667,264

[22] Filed: Mar. 11, 1991

[30] Foreign Application Priority Data

Apr. 9, 1990 [EP] European Pat. Off. ......... 90106777.7

[51] Int. Cl.$^5$ .................................. G03F 9/00
[52] U.S. Cl. ........................... 430/5; 430/269; 430/311
[58] Field of Search ............. 430/5, 22, 269, 311, 430/396

[56] References Cited

U.S. PATENT DOCUMENTS

| | | | |
|---|---|---|---|
| 5,045,417 | 9/1991 | Okamoto | 430/5 |
| 5,085,957 | 2/1992 | Hosono | 430/5 |

FOREIGN PATENT DOCUMENTS

| | | |
|---|---|---|
| 0090924 | 10/1983 | European Pat. Off. |
| 0234547 | 9/1987 | European Pat. Off. |
| 0211451 | 8/1990 | Japan |

OTHER PUBLICATIONS

IEEE Transactions on Electron Devices, vol. ED-29, No. 12, Dec., 1982, "Improving A Resolution In Photolithography With A Phase-Shifting Mask", by Marc D. Levenson et al, pp. 1828–1836.
SPIE vol. 470, Optical Microlithography III, Technology for the Next Decade (1984) "Optical Imaging With Phase Shift Masks", by Mark D. Prouty et al, pp. 228–232.
"Photomask", by Tsuneo Tdrasawa No. 60-134138, vol. 11, No. 162; (P-579) (1609) May 26, 1987. Abstract Only.
SPIE, vol. 1088 Optical/Laser Microlithography II (1989), "0.3-Micron Optical Lithography Using A Phase-Shifting Mask" by Tsuneo Terasawa et al, pp. 25–33.
"New Phase Shifting Mask With Self-Aligned Phase Shifters For A Quarter Micron Photolithography", by Akihiro Nitayama et al, IEDM 89-57, pp. 3.3.1–3.3.4.
SPIE vol. 1264 Optical/Laser Microlithography III (1990), "New Phase-Shifting Mask With Highly Transparent SiO$_2$ Phase Shifters", by Isamu Hanyu et al, pp. 167–177.

Primary Examiner—Marion E. McCamish
Assistant Examiner—S. Rosasco
Attorney, Agent, or Firm—Hill, Steadman & Simpson

[57] ABSTRACT

A carrier of light-transmissive material has a mask pattern of light-absorbent material arranged thereon. The carrier comprises first regions and second regions that are not covered by the absorbent material. An optical thickness of the carrier in the first regions differs from an optical thickness in the second regions such that a phase difference of 180°+/−60° exists between light that has traversed the first regions and light that has traversed the second regions. For manufacturing the phase mask, the first regions are produced by isotropic etching of the light-absorbent material and the second regions are produced by anisotropic etching into the carrier.

6 Claims, 3 Drawing Sheets

PHASE MASK FOR PROJECTION LITHOGRAPHY AND METHOD FOR THE MANUFACTURE THEREOF COMPRISING A SELECTIVELY ETCHABLE PHASE SHIFT LAYER DIRECTLY ON SUBSTRATE

BACKGROUND OF THE INVENTION

The invention is directed to a phase mask for projection lithography with light having a wavelength λ for use in an exposure means having an imaging scale m and having a numerical aperture NA. The invention is also directed to a manufacturing method for such a phase mask.

Higher and higher packing densities are desired in the development of semiconductor modules. This requires a greater and greater reduction in the minimal dimensions of the individual elements. Structural finenesses of less than 1 μm have already been achieved with the assistance of modern semiconductor technologies.

Constantly increasing demands made of the structuring technique are involved with the constant reduction in the minimum dimensions of the individual elements. In particular, the resolution of the exposure means utilized for the photolithography must be further improved in order to permit structuring that is dimensionally true.

The resolution is limited by diffraction effects at structural edges of a projection mask employed in the exposure means. When the light passes through the projection mask, a part of the passing luminesce intensity—as a result of diffraction effects—proceeds into regions that are covered by the projection mask.

Employing what is referred to as a phase-shifting mask or phase mask for the reduction of diffraction effects is known from M. D. Levenson et al., IEEE ED-29 (1982), page 1828. A phase mask is a projection mask wherein light that has passed through neighboring openings of the projection mask is shifted in phase. In this known phase mask, the phase shift amounts to 180°. A destructive interference between the two openings thereby arises, given exposure with coherent or partially coherent light. What this affects is that the intensity between the two openings is minimized. A phase mask is realized in that an opening in the projection mask is provided with a light-transmissive layer having the thickness $d = \lambda/2 (n-1)$, where n is the refractive index of the light-transmissive layer, and λ is the wavelength of the light.

In the manufacture of the phase mask, a layer of electron beam lacquer is applied onto a carrier that is provided with a mask pattern of light-absorbent material. This electron beam lacquer is structured in the above-described way with the assistance of electron beam lithography. An alternative is to apply a layer of $SiO_x$ or $MgF_2$ onto the finished mask pattern, this layer being structured with the assistance of electron beam lithography and subsequent dry-etching.

T. Terasawa et al., Proc. SPIE 1088 (1989), page 25 discloses a phase mask wherein electron beam lacquer is likewise employed in order to produce phase-shifting regions on the mask.

I. Hanyu et al., Abstract SPIE 1264 (1990) discloses a phase mask wherein the phase-shifting regions are composed of $SiO_2$. For manufacture, an electron beam lacquer structure is produced on the finished mask with the assistance of electron beam lithography. A $SiO_2$ layer is applied onto this electron beam lacquer structure. The regions of the $SiO_2$ having electron beam lacquer lying under them are removed with a lift-off process.

M. Nakase et al., Preprint IEDM (1989) discloses a phase mask wherein the phase-shifting regions are composed of electron beam lacquer. The phase-shifting regions are arranged in self-aligned fashion on the light-absorbing mask pattern. The electron beam lacquer projects beyond the light-absorbing regions on the mask at the respective edges thereof. As a result thereof, the light-transmissive regions each receive a respective border that shifts the light phase by 180°. The work by Prouty et al., Proc. SPIE 470 (1984), page 228 discloses that a reduction of the diffration effects can already be achieved with phase masks that effect a phase difference of $180° +/- 60°$.

What the methods for manufacturing phase masks of Levenson et al., Terasawa et al. and Hanyu et al. have in common is that they each require two electron beam lithography processes. This makes complicated equipment necessary for producing the masks. The method of Nakase et al. has the disadvantage that it employs masks having phase-shifting regions of electron beam lacquer. Such masks are difficult or impossible to clean. Moreover, the lacquer absorbs in the deep UV and, over and above this, has a refractive index differing from that of the mask carrier, this leading to multiple interferences.

SUMMARY OF THE INVENTION

An object of the invention is to specify a phase mask that can be manufactured without additional electron beam lithography, and which is easy to clean. Furthermore, it is also an object to specify a manufacturing method for such a mask.

For projection photolithography with light having a wavelength λ for use in an exposure means having an imaging scale m and a numerical aperture NA, this object is achieved according to the invention by a phase mask having the following features:

a) a carrier of light-transmissive material having a mask pattern of light-absorbent material arranged thereon is provided;

b) outside of the mask pattern, the carrier has first regions and second regions which are not covered by the absorbent material; and c) given exposure in a medium having the refractive index $n_1$, the optical thickness of the carrier in the second regions is lower by $d = \lambda(1 +/- \frac{1}{3})/(2(n_2 - n_1))$ than in the first regions, where $n_2$ is the refractive index in the first regions.

The different optical thickness of the carrier in the first regions and in the second regions causes a phase shift of the light which has passed through the first regions relative to light which has passed through the second regions. The phase shift thus lies in the range $180° +/- 60°$. It is critical for the invention that the phase-shifting regions are realized in the carrier of the phase mask itself.

The suppression of diffraction effects is optimum, given a phase shift of 180°.

It lies within the framework of the invention that the carrier is composed, for example, of quartz through and through. In this case, the light transmissivity is the same in the first regions and in the second regions.

In another embodiment, the carrier is composed of a substrate formed of a light transmissive, first material whose surface is exposed in the second regions. Structures composed of a light-transmissive, second material are arranged on the substrate, the surface of this second material lying exposed in the first region. The second material is selected such that it can be selectively etched relative to the substrate surface in an anisotropic etching process. It thus lies within the scope of the invention to provide the substrate of quartz with an etch-resistant cover layer of, for example, $Si_3N_4$, and to provide structures of quartz. It also lies within the scope of the invention to provide the substrate of sapphire and to provide structures of at least one of the substances $SiO_2$ and $Si_3N_4$.

This embodiment has the advantage that an etch stop during anisotropic etching into the carrier for producing the second regions on the substrate is established.

In a development of the invention, there are second regions that are annularly surrounded by one of the first regions in immediate adjacent fashion. This embodiment has the advantage that it can be manufactured in a self-aligned manufacturing method.

The object is also achieved by a manufacturing method for a phase mask for projection photolithography with first regions and second regions having the property that light of the wavelength $\lambda$ that has passed through the first regions and light of the wavelength $\lambda$ that has passed through the second region is phase-shifted by $180° +/- 60°$ relative to one another. This manufacturing method has the following steps:

a) a carrier of light-transmissive material is provided with a light-absorbing layer and with a photoresist layer;
b) after structuring the photoresist layer with conventional mask lithography, the first regions are produced by isotropic etching of the light-absorbing layer down to the surface of the carrier;
c) the second regions are produced by anisotropic etching of the carrier to a depth $d = \lambda(1 +/- \frac{1}{3})/2(n_2 - n_1)$, whereby $n_2$ is the refractive index in the first regions and $n_1$ is the refractive index of the surrounding medium.

It lies within the framework of the invention to produce the first regions such that the light-absorbing layer is etched back under the structured photoresist layer during the isotropic etching. A region of the carrier, wherein the carrier surface is uncovered under the photoresist structures, thus arises. The expanse of the photoresist structure is transferred onto the second regions in the manufacture of the second regions on the basis of anisotropic etching. The self-aligned annular arrangement of first regions around second regions can be achieved in this way.

The suppression of diffraction effects in the finished phase mask in an exposure means having the imaging scale m and the numerical aperture NA is especially effective when the expanse of the under-etching under the structured photoresist layer amounts to $a = (c/m) \cdot \lambda / NA$ per edge, whereby $c = 0.12 +/- 0.08$ applies.

The invention shall be set forth in greater detail below with reference to exemplary embodiments and with reference to the figures.

DESCRIPTION OF THE PREFERRED EMBODIMENTS

Figure 1:
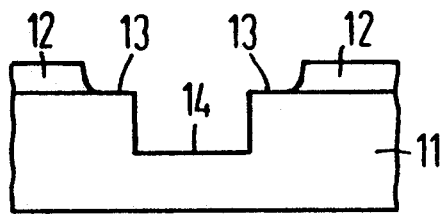
FIG. 1 shows a portion of a phase mask having a carrier that is composed of one and the same material throughout and that defines a second region that is annularly surrounded by a first region.

FIG. 1 shows a carrier 11. This carrier 11, for example, is composed of quartz. A mask pattern 12 is arranged on the carrier 11. The mask pattern 12 is composed of light-absorbent material, for example of chromium. A first region 13 and a second region 14 are present on the carrier 11. The surface of the carrier 11 is uncovered both in the first region 13 as well as in the second region 14. The first region 13 annularly surrounds the second region 14. The first region 13 and the second region 14 are thus immediately adjacent to one another. The optical thickness of the carrier 11 is $d = \lambda(1 +/- \frac{1}{3})/(2(n_2 - n_1))$ smaller in the second region 14 than in the first region 13. $\lambda$ is the wavelength of the light employed in the exposure; $n_2$ is the refractive index of the carrier; and $n_1$ is the refractive index of the surrounding medium. In the case of air, vacuum, or nitrogen as the surrounding medium, $n_1$ is 1. Light that traverses the phase mask in the first region 13 is phase-shifted by $180° +/- 60°$ in comparison to light that traverses the phase mask in the second region 14.

Figure 2:
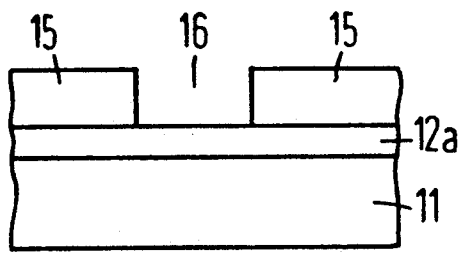
FIGS. 2 through 4 show a manufacturing method for this mask.

A light-absorbing layer 12a is applied onto the carrier 11 for manufacturing the phase mask. The light-absorbing layer 12a, for example, is composed of chromium and has a thickness of approximately 100 nm. A photoresist layer is applied onto the light-absorbing layer 12a and is structured with conventional optical lithography to form photoresist structures 15. The photoresist structures 15 have an opening 16. The opening 16 defines the lateral expanse of the second region 14 (see FIG. 2).

Figure 3:
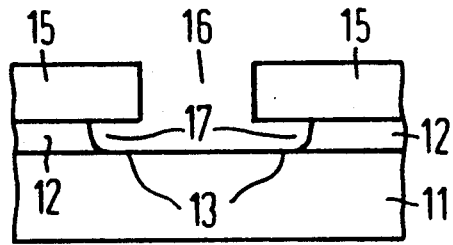

The light-absorbing layer 12a is etched through the opening 16 in an isotropic etching process. For example, cerium ammonium nitrate is suitable as an etchant. The isotropic etching process is selective vis-a-vis the surface of the carrier 11. The isotropic etching is over-drawn so that undercuts 17 arise under the photoresist structures 15. The surface of the first region 13 is uncovered due to the undercuts 17 (see FIG. 3). The mask pattern 12 therefore arises from the light-absorbing layer 12a.

Figure 4:
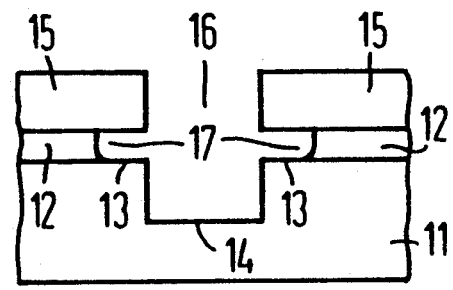

An anisotropic etching process follows for generating the second region 14 (see FIG. 4). The expanse of the opening 16 is thus transferred into the carrier 11. For example, a plasma etching with a $CHF_3/O_2$ gas mixture is suitable as the anisotropic etching process. The duration of the anisotropic etching process must be dimensioned such that the material of the carrier is eroded to a depth of $d=\lambda(1+/-\frac{1}{3})/(2(n_2-n_1))$. The structure shown in FIG. 1 arises after the photoresist structures 15 are removed.

Figure 5:
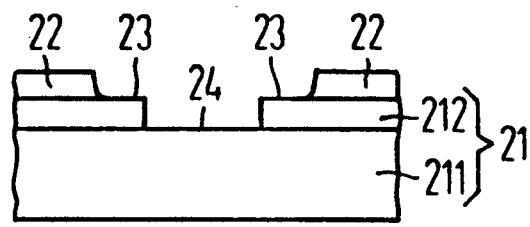
FIG. 5 shows a portion of a phase mask wherein the carrier is composed of a substrate and of an auxiliary layer arranged thereon, and that defines a first region that annularly surrounds a second region.

FIG. 5 shows the portion of a phase mask that comprises a composite carrier 21. The carrier 21 contains a substrate 211 and carrier structures 212 arranged thereon. The substrate 211, for example, is composed of quartz having a thin cover layer of etch-resistant material 100, for example $Si_3N_4$; and the carrier structures 212 are composed of quartz. The substrate 211, for example, can also be composed of sapphire; the carrier structures 212 are then composed of $SiO_2$ and/or $Si_3N_4$. A first region 23 in which the surface of the carrier structures 212 lies exposed is provided. The first region 23 annularly surrounds a second region 24 in which the surface of the substrate 211 lies exposed. The carrier structures 212 have a thickness of $d=\lambda(1+/-\frac{1}{3})/2(n_2-n_1))$. Here, $n_2$ is the refractive index of the material of the structures 212. The other parameters have the same significance as in the first exemplary embodiment.

Figure 6:
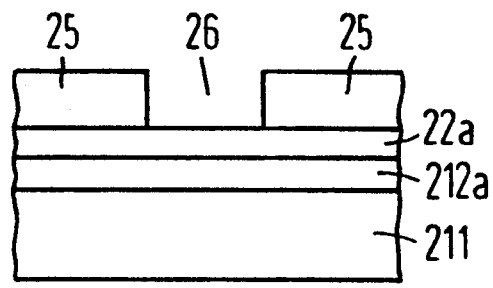
FIGS. 6 through 8 show manufacturing steps for this mask.

For manufacturing a phase mask, a portion of which is shown in FIG. 5, an auxiliary layer 212a is applied onto the substrate 211 (see FIG. 6). The auxiliary layer 212a is composed of the same material as the structures 212 that can be selectively etched vis-a-vis the surface of the substrate 211. A light-absorbing layer 22a is applied onto the auxiliary layer 212a. Photoresist structures 25 having an opening 26 are produced on the light-absorbing layer 22a with conventional optical lithography.

The light-absorbing layer 22a is etched back with an isotropic etching process. The isotropic etching process etches the light-absorbing material selectively vis-a-vis the auxiliary layer 212a lying therebelow. For example, the following etching process is suitable: immersion into cerium ammonium nitrate.

Figure 7:
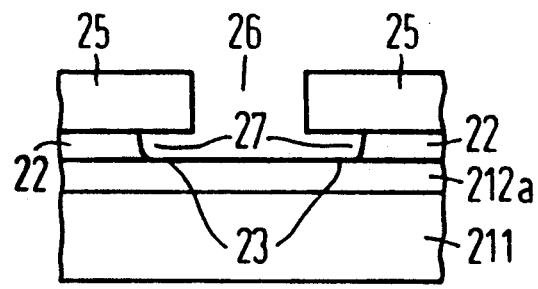

In this step, the mask pattern 22 (see FIG. 7) arises from the light-absorbing layer 22a. An undercutting 27, in the region of which the surface of the first region 23 lies exposed, arises.

Figure 8:
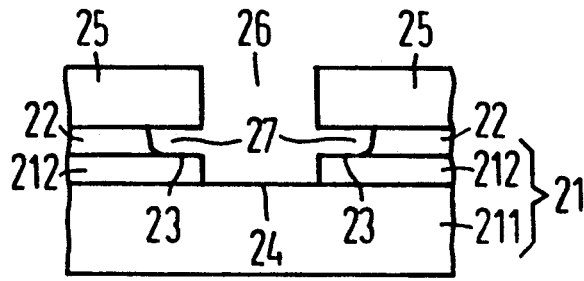

The pattern of the photoresist structures 25 is transferred into the auxiliary layer 212a with an anisotropic etching process. The structures 212 thus arise. The material of the auxiliary layer 212a is selected such that the anisotropic etching occurs with good selectivity vis-a-vis the substrate 211 lying therebelow. In this case, an overdrawing of the etching is possible, as a result whereof vertical side walls of the structures 212, and a right angle between the side walls of the structures 212 and the substrate 211, can be achieved. In the anisotropic etching process, the surface of the substrate 211 is uncovered in the region of the second region 24 (see FIG. 8). A $CHF_3/O_2$ plasma having a small $O_2$ part is particularly suitable for the anisotropic etching process.

The structure shown in FIG. 5 results after the removal of the photoresist structures 25.

It was found with the assistance of simulation calculations that were implemented with the program Sample 1.7 of Berkeley University, that the affect of the phase mask is particularly good with reference to the suppression of diffraction effects when the underetching 17, 27 has an expanse parallel to the surface of the carrier of $a=(c/m)\cdot\lambda/NA$, where m represents the imaging scale, NA represents the numerical aperture of an exposure means in which the phase mask is utilized, and c is a constant whose value lies between 0.04 and 0.20 for the optimum effect of the diffraction suppression. The simulation calculations were carried out for insulated lines, insulated columns, and lattices having a structural size w, this corresponding to $k_1=w\cdot NA/\lambda=0.63$.

Figure 9:
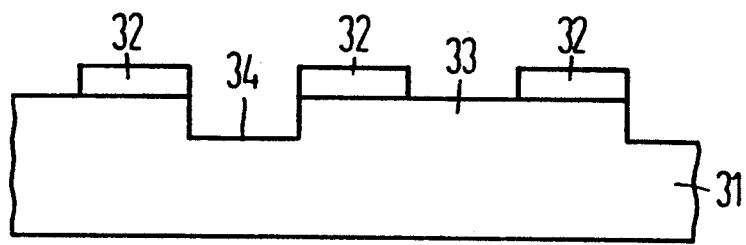
FIG. 9 shows a portion of a phase mask having a carrier that is composed of one and the same material throughout, and that defines first and second regions separated by light-absorbing material.

FIG. 9 shows a portion of a phase mask having a carrier 31 and a mask pattern 32 arranged thereon. The carrier 31 comprises a first region 33 and a second region 34. The optical thickness of the carrier is $d=\lambda(1+/-\frac{1}{3})/(2(n_2-n_1))$ greater in the first region 33 than in the second region 34 (parameters as in FIG. 1). The carrier 31 is composed of quartz throughout. The mask pattern 32 is composed of a light-absorbent material, for example chromium. The first region 33 and the second region 34 are separated from one another by a part of the mask pattern 32.

Figure 10:
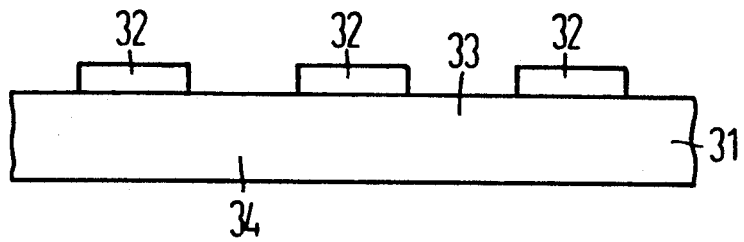
FIGS. 10 through 12 show manufacturing steps for this mask.

For manufacturing a phase mask whereof a portion is shown in FIG. 9, the mask pattern 32 is produced on the carrier 31 with a conventional optical phototechnique. The mask pattern 32 arises from a light-absorbing layer on the basis of an isotropic etching, for example with cerium ammonium nitrate (see FIG. 10). The mask pattern 32 leaves the surface of the carrier 31 uncovered where the first region 33 and the second region 34 are provided.

Figure 11:
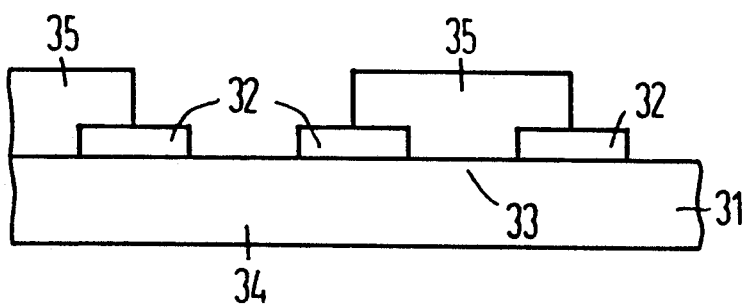

Photoresist structures 35 are produced on the carrier 31 with the mask pattern 32 on the basis of conventional phototechnique. The photoresist structures 35 cover the first region 33, whereas they leave the carrier surface exposed in the region wherein the second region 34 is intended to arise (see FIG. 11).

Figure 12:
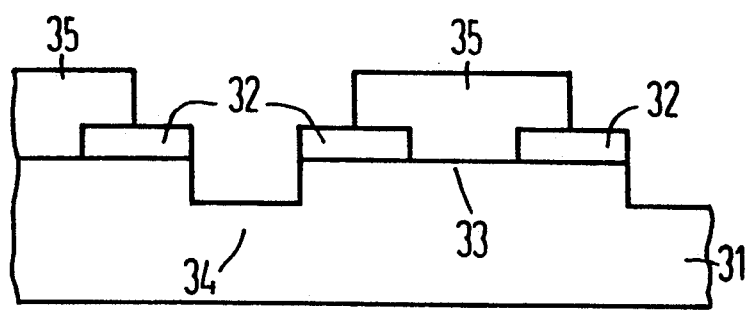

The second region 34 is produced with an anisotropic etching into the carrier 31 (see FIG. 12). In the anisotropic etching, the neighboring parts of the mask pattern 32 act as an etching mask. The second region 33 is protected by the photoresist structure 35. The etching into the carrier 31 is implemented for such a time period that the material of the carrier 31 is etched off down to a depth of $d=\lambda(1+/-\frac{1}{3})/(2(n_2-n_1))$. For example, $CHF_3/O_2$ plasma etching is particularly suitable for the anisotropic etching process.

The structures shown in FIG. 9 result after the removal of the photoresist structures 35.

Figure 13:
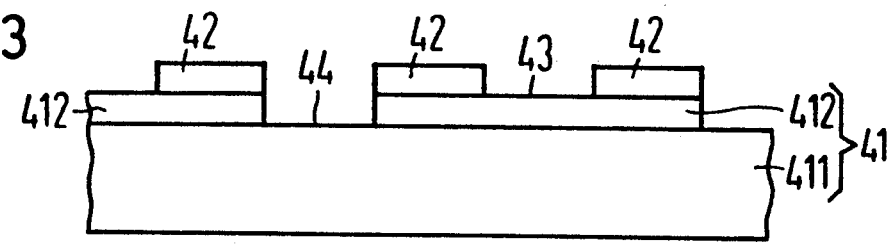
FIG. 13 shows a portion of a phase mask wherein the carrier is composed of a substrate and of an auxiliary layer arranged thereon, and which defines first and second regions separated by light-absorbing material.

FIG. 13 shows a portion of a phase mask that comprises a carrier 41. The carrier 41 is formed of a substrate 411, and of structures 412 arranged thereon. For example, the substrate is composed of quartz having a thin, etch-resistant layer of, for example, $Si_3N_4$ and the structures 412 are composed of quartz. In another example, the substrate 411 is composed of sapphire and the structures are composed of $SiO_2$ and/or $Si_3N_4$. A mask pattern 42 is arranged on the structures 412. The mask pattern 42 is composed of light-absorbent material, for example of chromium. The carrier 41 comprises a first region 43 in which the surface of the structure 412 lies exposed. The carrier comprises a second region 44 wherein the surface of the substrate 411 lies exposed. Since the structures 412 have a thickness of $d=\lambda(1+/-\frac{1}{3})/(2(n_2-n_1))$ (parameters as in FIG. 5), the optical thickness in the first region differs from the optical thickness in the second region of the carrier 41 such that light passing through the first region 43 and light passing through the second region 44 have a phase difference of $180°+/-60°$.

Figure 14:
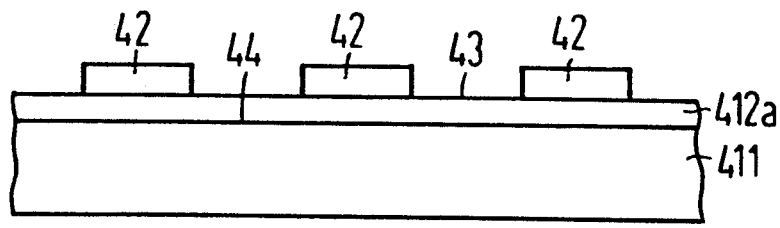
FIGS. 14 through 16 show manufacturing steps for this mask.

For manufacturing the phase mask whereof a portion is shown in FIG. 13, an auxiliary layer 412a of the material of the structures 412 is applied onto the substrate 411, this material being selectively etchable vis-a-vis the surface of the substrate 411. The mask pattern 42 is produced with a conventional optical phototechnique and with isotropic etching. The surface of the auxiliary layer 412a is uncovered in the region of the first region 43 and of the second region 44 (see FIG. 14).

Figure 15:
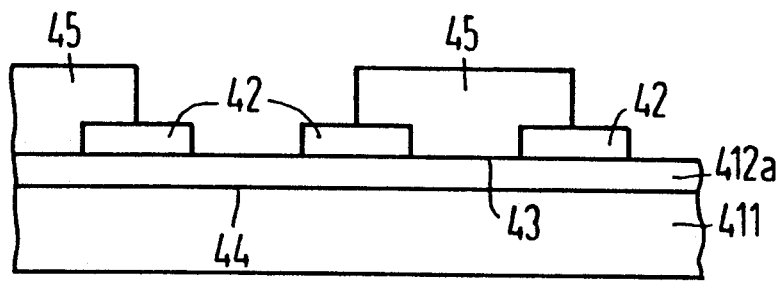

Photoresist structures 45 are produced from the auxiliary layer 412a and from the mask pattern 42 arranged thereon. They are produced with the assistance of a lithography process. The photoresist structures 45 cover the surface of the auxiliary layer 412a of the first region 43. The surface of the auxiliary layer 412a is uncovered in the second region 44 (see FIG. 15).

Figure 16:
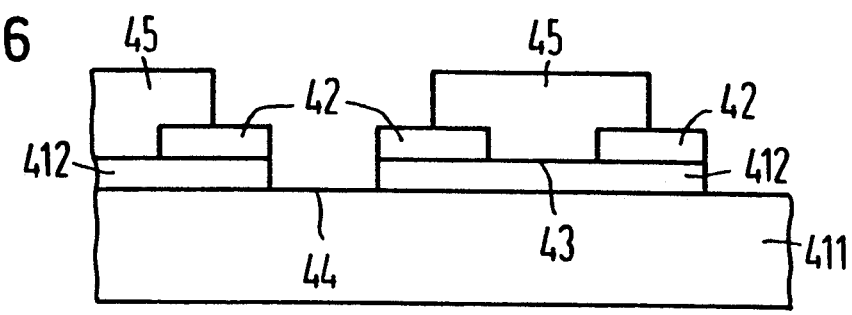

The material of the auxiliary layer 412a is selected such that the auxiliary layer 412a is selectively etchable vis-a-vis the surface of the substrate 411 in an anisotropic etching process. The structures 412 are produced with the assistance of such an anisotropic etching process (see FIG. 16). The second region 44 arises by etching off the auxiliary layer 412a in this region. The neighboring mask patterns 42 thus act as an etching mask. Since the auxiliary 412a is etchable with good selectivity vis-a-vis the surface of the substrate 411, the difference in the optical thickness in the first region 43 and in the second region 44 can be very exactly set on the basis of the layer thickness of the auxiliary layer 412a.

The structure shown in FIG. 13 results after the removal of the photoresist structures 45.

In the four described exemplary embodiments, the manufacture of the phase masks utilizes only standard process steps that are usual in semiconductor technology or mask techniques. Commercially obtained mask carriers are employed in the first and in the third exemplary embodiment. Only the anisotropic mask etching arises as an additional process step in all four exemplary embodiments.

Phase masks having first and second regions that are arranged in self-aligned fashion relative to the mask pattern have been set forth with reference to FIGS. 1 through 8. There the first regions annularly surround the second regions. There is thus the advantage that no separating, light-absorbing regions on the mask are required at the individual structures. The applicability is thus considerably simplified. Phase masks conforming to the third and fourth exemplary embodiments that were set forth with reference to FIGS. 9 through 16 have a higher potential for improving resolution and process latitude.

Although various minor changes and modifications might be proposed by those skilled in the art, it will be understood that we wish to include within the claims of the patent warranted hereon all such changes and modifications as reasonably come within our contribution to the art.

We claim as our invention:

1. A projection lithography phase mask used with light having a wavelength $\lambda$ and an exposure means having an imaging scale m and a numerical aperture NA, comprising:

a composite carrier comprised of a substrate formed of a light-transmissive first material and a carrier structure directly on the substrate of a light-transmissive second material having a refractive index $n_2$, and wherein the second material is selectively etchable with respect to the surface of the substrate in an anisotropic etching process;

the carrier structure having a mask pattern directly thereon with openings at selected first regions where a surface of the carrier structure is exposed, and the carrier structure having openings therein so as to expose the substrate at selected second regions; and given exposure in a medium having a refractive index $n_1$, the substrate at said second region having an optical thickness which is lower by $d=\lambda(1 +/- \frac{1}{2})/(2(n_2-n_1))$ than an optical thickness of said composite carrier formed of said carrier structure and substrate at said first regions.

2. A phase mask according to claim 1 wherein the substrate is formed of sapphire and the carrier structure is formed of at least one of the substances $SiO_2$ and $Si_3N_4$.

3. A phase mask according to claim 1 wherein the mask pattern is formed of chromium having a layer thickness of at least 80 nm.

4. A phase mask according to claim 1 wherein the second region annularly surrounds and is immediately adjacent to the first region.

5. A phase mask according to claim 1 wherein the first region has a radial expanse of $a=(c/m)\cdot\lambda/NA$, where c is a constant which assumes values in a range $0.04 \leq c \leq 0.20$.

6. A phase mask according to claim 1 wherein the substrate comprises quartz and has a relatively thin cover layer comprising $Si_3N_4$, and wherein the carrier structure comprises $SiO_2$.

* * * * *